United States Patent [19]
Lin et al.

[11] Patent Number: 6,150,216
[45] Date of Patent: Nov. 21, 2000

[54] METHOD FOR FORMING AN ELECTRODE OF SEMICONDUCTOR DEVICE CAPACITOR

[75] Inventors: Kuo-Chi Lin; Kun-Chi Lin, both of Hsin-Chu, Taiwan

[73] Assignee: United Microelectronics Corp., Hsin-Chu, Taiwan

[21] Appl. No.: 09/222,737

[22] Filed: Dec. 29, 1998

[51] Int. Cl.[7] .................. H01L 21/20; H01L 21/8242; H01G 4/06; H01G 4/30
[52] U.S. Cl. .............. 438/255; 438/396; 438/398; 438/253; 257/300; 257/306; 257/532
[58] Field of Search ........................ 438/253, 255, 438/256, 398, 399, 396, 239, 190, 244, 236, 254, 397, 528; 257/900, 300, 296, 303, 304, 306, 308, 309, 307, 295, 532, 535

[56] References Cited

U.S. PATENT DOCUMENTS

| | | | |
|---|---|---|---|
| 5,792,691 | 8/1998 | Koga | 438/233 |
| 5,843,834 | 12/1998 | Naem | 438/564 |
| 5,877,052 | 3/1999 | Lin et al. | 438/238 |
| 5,885,886 | 3/1999 | Lee | 438/528 |
| 5,937,307 | 8/1999 | Jenq et al. | 438/398 |
| 5,994,197 | 11/1999 | Liao | 438/396 |
| 6,013,546 | 1/2000 | Gardener et al. | 438/231 |

*Primary Examiner*—Mary Wilczewski

[57] ABSTRACT

A method for forming an electrode of semiconductor device capacitor is disclosed. The method comprises forming a dielectric layer on a semiconductor substrate and then using photolithographic method to etch a trench through the dielectric layer to expose specific part of the semiconductor substrate. A polysilicon layer is then formed over the dielectric layer and filled the trench. The polysilicon layer is patterned by a photoresist layer and etched back to the dielectric layer, then a polysilicon rod is formed. A spacer method is used to form an amorphized silicon spacer is sidewall of the polysilicon rod. The polysilicon rod is then implanted to form an amorphized polysilicon layer on top surface of the polysilicon rod. Final hemispherical grain silicon is formed on the spacer and the amorphized polysilicon layer to increase the surface area of the polysilicon rod. Thereby, an electrode of a semiconductor device capacitor is formed, and the capacitance of capacitor is enhanced.

14 Claims, 5 Drawing Sheets

METHOD FOR FORMING AN ELECTRODE OF SEMICONDUCTOR DEVICE CAPACITOR

BACKGROUND OF THE INVENTION

1. Field of the Invention

The present invention relates to fabrication of semiconductor device capacitor, and more particularity to a method for forming an electrode of semiconductor device capacitor.

2. Description of the Prior Art

Recently, the demand of semiconductor devices has increased rapidly owing to widespread use of electronic equipment. In particular, the increasing popularity of some electronic equipment is increasing the demand for minimized semiconductor devices. By the way, to minimize elements of semiconductor devices is a contemporary tendency for producing integrated semiconductor devices.

As the semiconductor device is highly integrated, there are some problems happened. For example, the area occupied by a capacitor is shrank and the capacitance of the capacitor is decreased owing to its smaller electrode surface. No matter how, a plurality of specific semiconductor devices require a relatively large capacitance for reliable operation. For example, the memory cell requires high capacitance to achieve a high signal-to-noise ration. Therefore, it is desirable to reduce the capacitor scale for device integration and yet obtains enough capacitance for operation of capacitor.

One approach for solving the problem is toward the shape of the capacitor electrode, which is usually a conductive structure, for example a polysilicon rod. The essential point is increasing the total surface of the capacitor electrode when the occupied area of capacitor electrode on the semiconductor device is small. One important method is stacked design, with the technology two or more layers of conductive layers such as polycrystalline silicon (polysilicon) are deposited on a semiconductor substrate, with dielectric layers sandwiched between each conductive layer. In additional, the capacitance can be enhanced by using the hemi-spherical grain (HSG) silicon on an electrode to form a rugged surface but without increasing the area required for the electrode. It means that a polysilicon rod is applied to form the basic structure of electrode and HSG silicon is formed on surface of the polysilicon rod to increase total surface of electrode.

Because the growth of HSG demands amorphized silicon, the polysilicon rod must be amorphized. Replace polysilicon rod totally by amorphized silicon rod is not an efficient way, owing to the growth time of amorphized silicon is long and then the probability of crystallization of silicon is not negligible. However, the growth of HSG silicon only reacts with the surface part of electrode so only the surface part of polysilicon rod needs to be amorphized. Two processes are usually used to form the amorphized silicon, one is the implantation process and another is the spacer process. The former uses impurity particles to implant the surface of polysilicon electrode and transforms the structure of surface part from polysilicon into amorphized silicon. The process is an efficient process. But when a plurality of electrodes is formed by the process, an obvious disadvantage happens. If the distance between any two neighboring electrodes is short or the height of electrode is large, these neighboring sidewalls of electrodes are screened by other electrodes and these implanting particles are impeded. The result is that the thickness of amorphized silicon is not uniform, that is, it is thicker in top part of sidewall but is thinner or even zero in bottom part of sidewall. By the way, the growth of HSG silicon in the bottom part of sidewall of electrode is restricted by the thickness of amorphized silicon. FIG. 1A shows the effect, where the thickness of amorphized silicon 10 is non-uniform in neighboring sidewalls of two polysilicon rods 12, but is uniform in other sidewalls. Another process for growth of HSG silicon is the spacer process, it includes two steps as shows in FIG. 1B and FIG. 1C. First amorphized silicon layer 14 is formed on top of polysilicon rods 12 and then amorphized silicon spacers 16 are formed in sidewalls of polysilicon is rods 12. By the process, the thickness of amorphized silicon is always enough in every part of sidewall for growth of HSG silicon, but the process consumes much time for two deposition processes and some photolithography processes are necessary and then throughout of the process is slow.

Thus, there is a need for an efficient method to form amorphized silicon on surface of polysilicon rod with enough thickness everywhere, such that hemispherical grain silicon is growing on total surface of polysilicon rod and then the capacitance of capacitor is increased.

SUMMARY OF THE INVENTION

In accordance with the present invention, a method is provided for forming an electrode of semiconductor device capacitor. Furthermore, both implantation process and spacer process are used in sequence to form the amorphized silicon, such that the growth of amorphized silicon is over total surface of electrode and the invention is an efficient method with high throughput.

In one embodiment, the method is used to form a capacitor electrode of semiconductor device. A dielectric layer is formed on a substrate, and then is planarized via use of an etch back or other conventional planarization methods. Afterwards, a photoresist layer is formed on the dielectric layer and conventional photolithography techniques are used to define trench area in the photoresist layer. Using the photoresist layer as a mask, a portion of the dielectric layer is etched and then forming a trench that exposes a portion of the substrate. The residual photoresist layer is removed and then a polysilicon layer is formed over the dielectric layer and filling the trench, the polysilicon layer is usually doping with either donor particles or acceptor particles to enhance the conductivity of polysilicon. Another photoresist layer is used to define a capacitor area over the polysilicon layer, the capacitor area corresponding to the trench. The polysilicon layer is etched back to the dielectric layer, and then the residual photoresist layer is removed. A polysilicon rod is then formed as the basic structure of electrode.

In order to form an amorphized silicon layer on surface of the polysilicon rod, first, spacer process is used to form amorphized layer in sidewall of the polysilicon rod. An amorphized silicon layer is deposited over the dielectric layer and the polysilicon rod, then etched back to the dielectric layer such that the spacer is formed by residual amorphized silicon on the sidewall of polysilicon rod. Second, a top implantation process is used to implant the polysilicon layer by impurity particles, and then form amorphized silicon layer on top of the polysilicon rod. Finally, hemi-spherical grain silicon is formed on the amorphized silicon on the surface of polysilicon rod, where the process of grain formation comprises annealing amorphized silicon. Then an electrode of capacitor of semiconductor device is formed, the surface area of electrode is increasing by hemi-spherical grain silicon and the capacitance of capacitor is enhanced.

In another embodiment according to the present invention, the method is used to a specific case for forming an electrode of a dynamic random access memory capacitor. In the embodiment, the dielectric layer is a silicon oxide layer and the substrate is a silicon substrate that includes a metal-oxide-semiconductor transistor or other elements of dynamic random access memory. The trench in the embodiment is corresponding to the metal-oxide-semiconductor transistor or other elements of dynamic random access memory. The implanting particles are donor particles for the electrode direct connected to substrate is a negative electrode. These other parts of the embodiment are similar to the previous embodiment.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
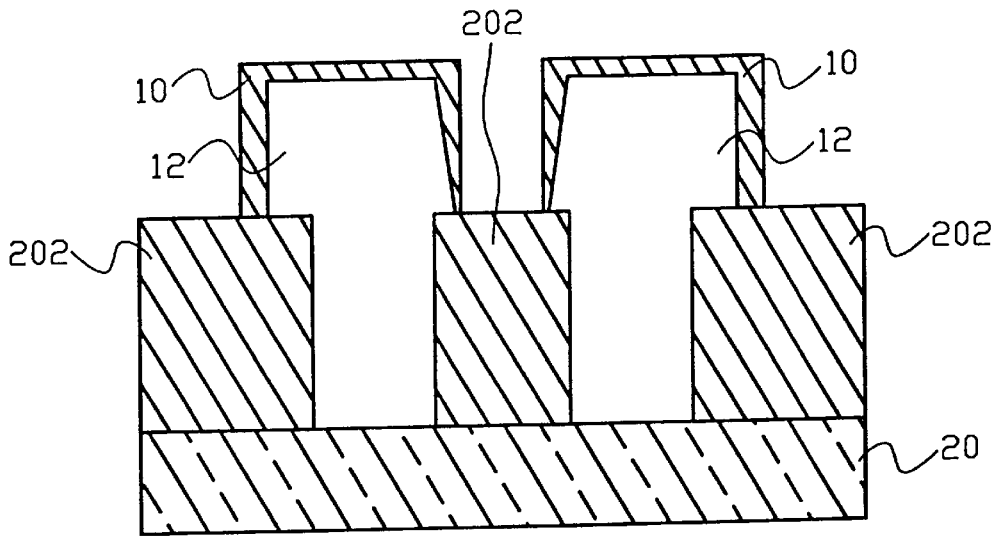
FIG. 1A shows a cross sectional view illustrative of a polysilicon rod structure with implanted amorphized silicon.
Figure 1B:
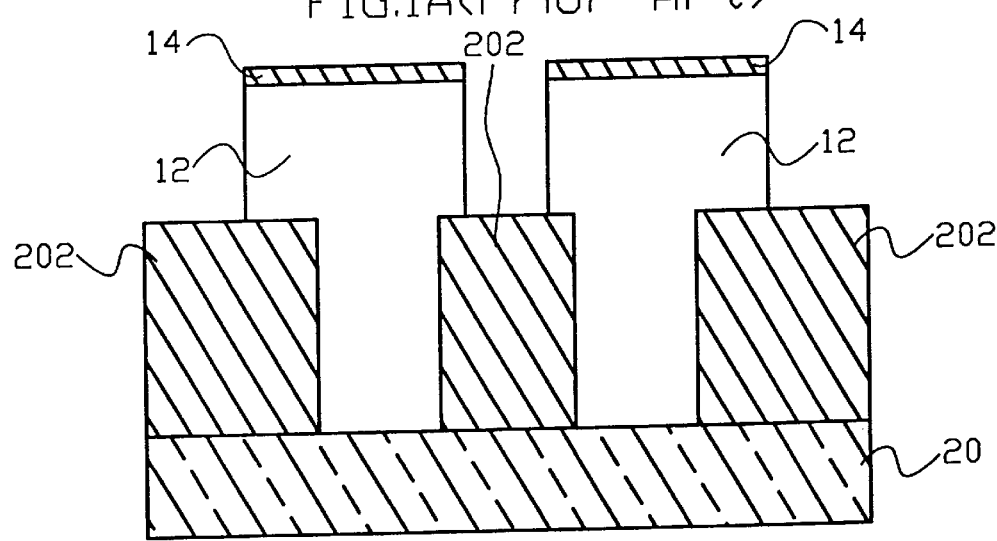
FIGS. 1B and 1C show cross sectional views illustrative of two stages of a polysilicon rod structure with amorphized silicon spacer.
Figure 1C:
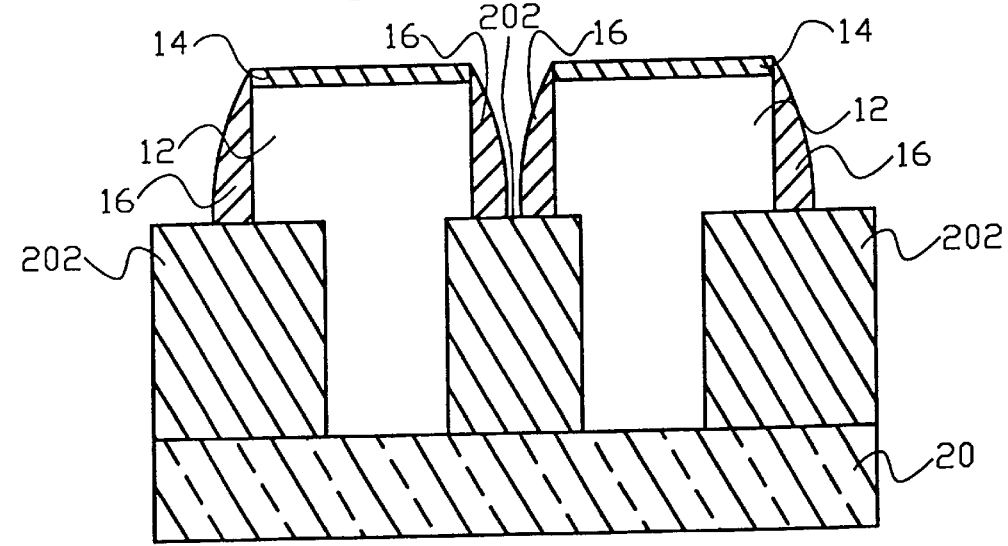
Figure 2A:
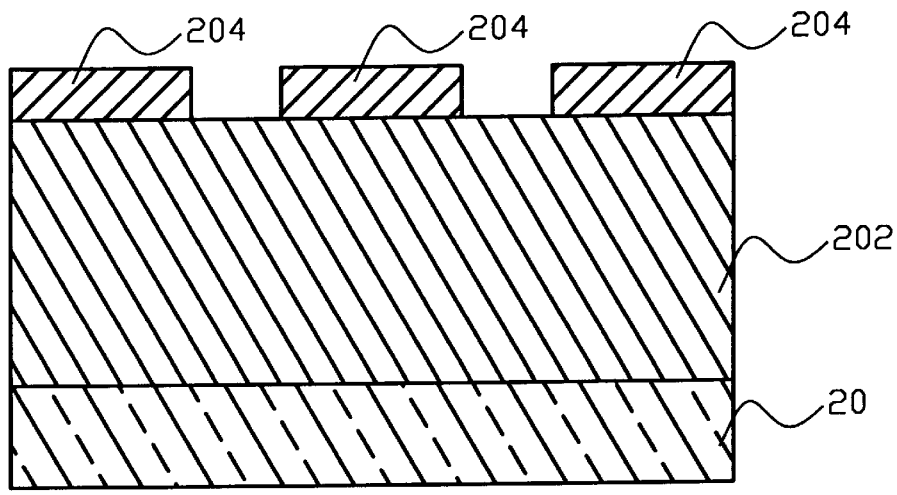
FIG. 2A to FIG. 2F show cross-sectional views illustrative of various stages in the fabrication of an electrode of capacitor of a semiconductor device with one embodiment of the present invention.

In one embodiment a capacitor electrode of semiconductor device is formed. Referring to FIG. 2A, a semiconductor substrate 20 is used to form any element of semiconductor device in and on it. First, a dielectric layer 202 is formed on the substrate 20 using a chemical vapor deposition (CVD) method, typically to a thickness of about 2000 to 9000 angstroms. The dielectric layer 202 is then planarized by any conventional planarization method such as chemical mechanical polishing (CMP).

Figure 2B:
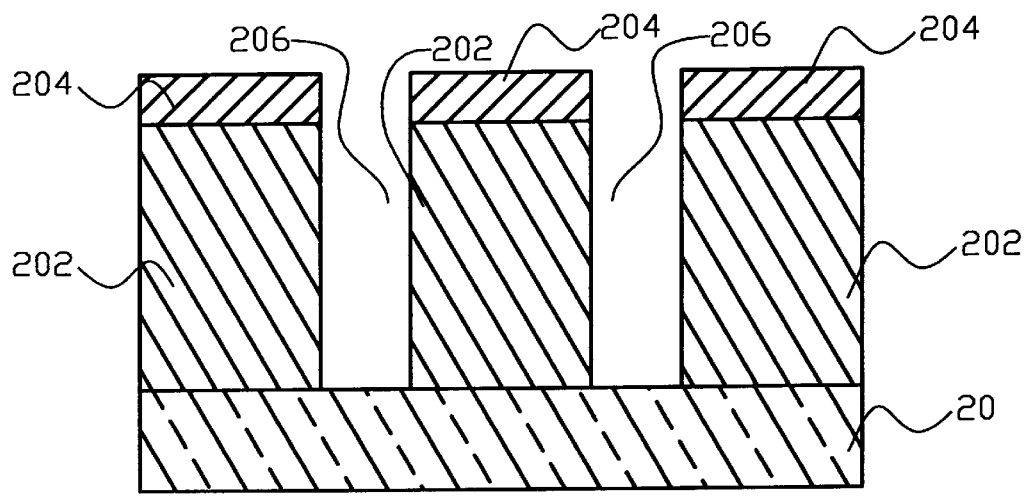

Afterwards, conventional photolithography techniques are used to define capacitor area in a photoresist layer 204 formed on the dielectric layer as shown in FIG. 2B. The photoresist layer 204 is patterned to expose a portion of the dielectric over a specific region of substrate 20, where the specific region corresponding to some specific element in the substrate, such as field effect transistor (MOS).

By using the photoresist layer 204 as an etching mask, the dielectric layer 202 is anisotropically etched. Trenches 206 are thus formed in the dielectric layer 202 to expose a portion of the substrate. Then the residual photoresist layer is stripped.

Figure 2C:
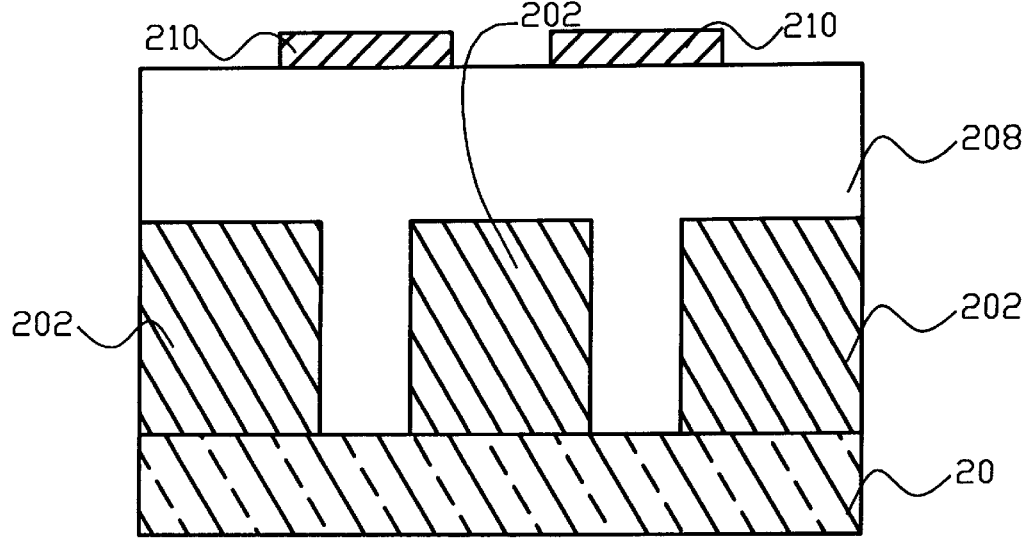

As shown in FIG. 2C. A polysilicon layer 208 is deposed over the dielectric layer 202 to fill the trench 206. The thickness of polysilicon layer 208 above the dielectric layer 202 is decided by the final required structure of electrode. Typically, the polysilicon layer 208 is doped with impurity particles of donor or acceptor to increase conductivity, which impurity is used mainly decided by the polarity and material of required electrode.

Figure 2D:
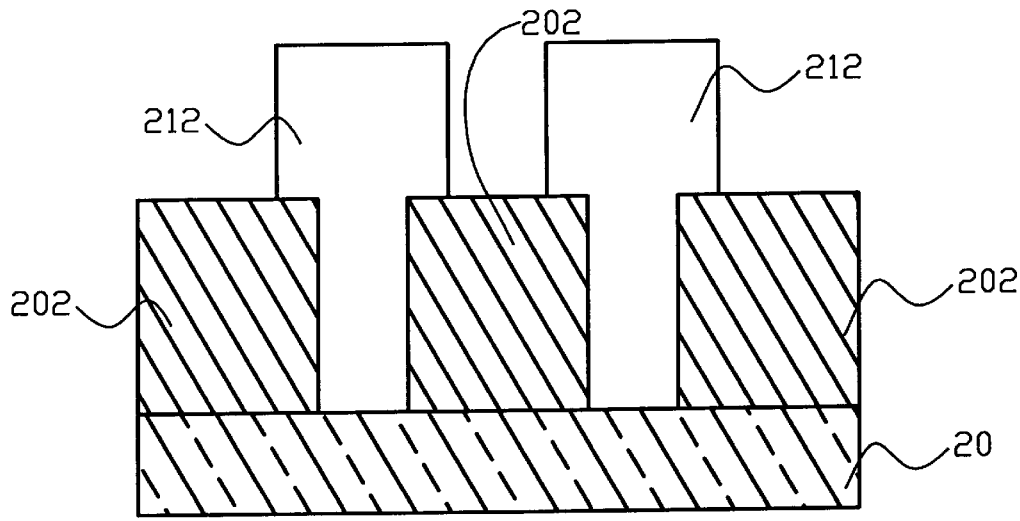

Another photoresist layer 210 is formed on the polysilicon layer 208 to define the capacitor region over a portion of polysilicon layer 208, where capacitor region covers the trench 206. The polysilicon layer 208 is anisotropically etched back by using the dielectric layer 202 as an etchstop layer. When the etching process is complete, the residual photoresist layer 210 is removed and polysilicon rod 212 is thus formed in the trench 206, as shown in FIG. 2D.

Figure 2E:
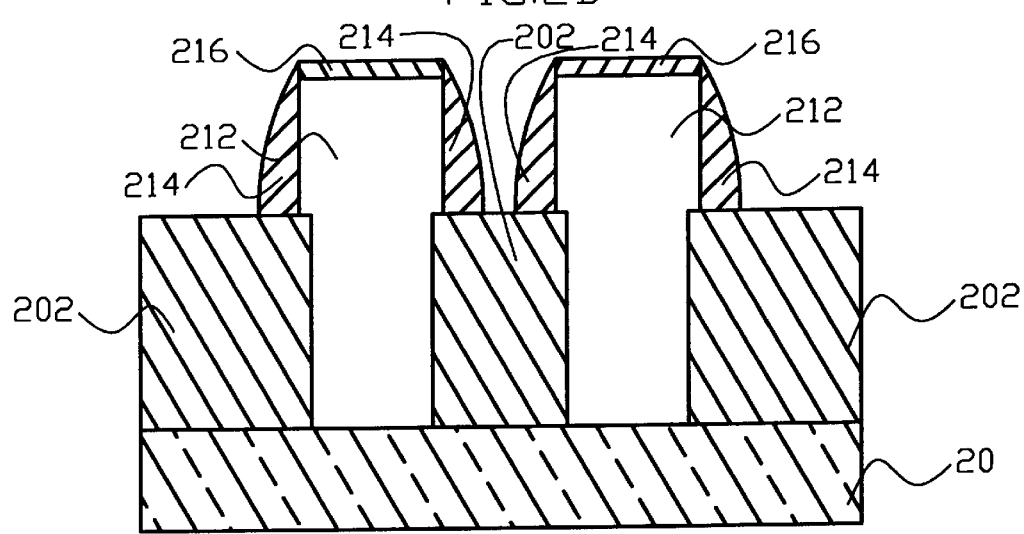

A spacer process is used to form amorphized silicon 214 on sidewall of polysilicon rod, as shown in FIG. 2E. First, an amorphized silicon layer is deposited over the dielectric layer 202 and polysilicon rods 212. Second, the deposited amorphized layer is anisotropically etched back by using the dielectric layer 202 as etchstop layer. Because the amorphized layer is formed by deposition so the thickness of it is not uniform everywhere, it is thicker near the sidewall of polysilicon rod 212 and is uniform over other part of dielectric layer 202 and top of polysilicon rod 212. The result is that spacer 214 is formed by residual non-etched amorphized silicon in sidewall of trench. The thickness is controllable and is adjusted to a sufficient value such that during following process of hemi-spherical grained silicon formation, grain formation only reacts with the amorphized polysilicon spacer 214 and never touches the polysilicon rod 212. The typically thickness of amorphized silicon spacer is about 1000 angstroms.

Subsequently, a top implantation process is used to form an amorphized silicon layer 216 on top surface of polysilicon rod 212. The lo polarity of implanting particles is the same as the polarity of electrode, and the mass of implanting particle must be heavier than silicon. For a negative electrode, implanting particles comprise arsenic and phosphorous. The thickness of amorphized silicon layer 216 is proportion to the implanting time and is adjusted to a sufficient value such that during following process of hemispherical grained silicon formation, grain formation only consumes amorphized polysilicon layer 216 and never touch the polysilicon rod 212. The typically thickness of amorphized silicon layer is about 1000 angstroms.

Figure 2F:
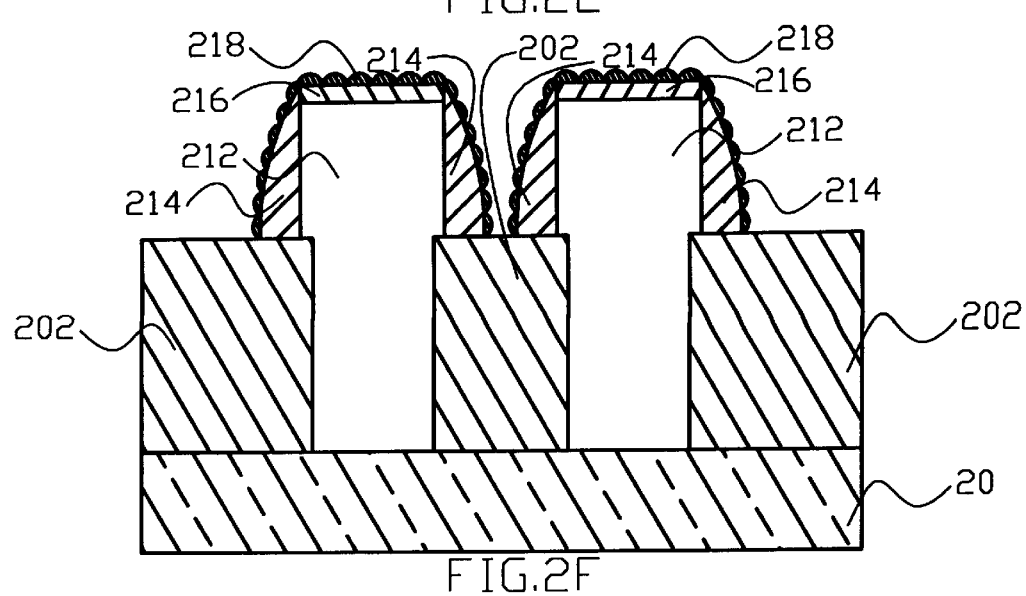
Figure 3A:
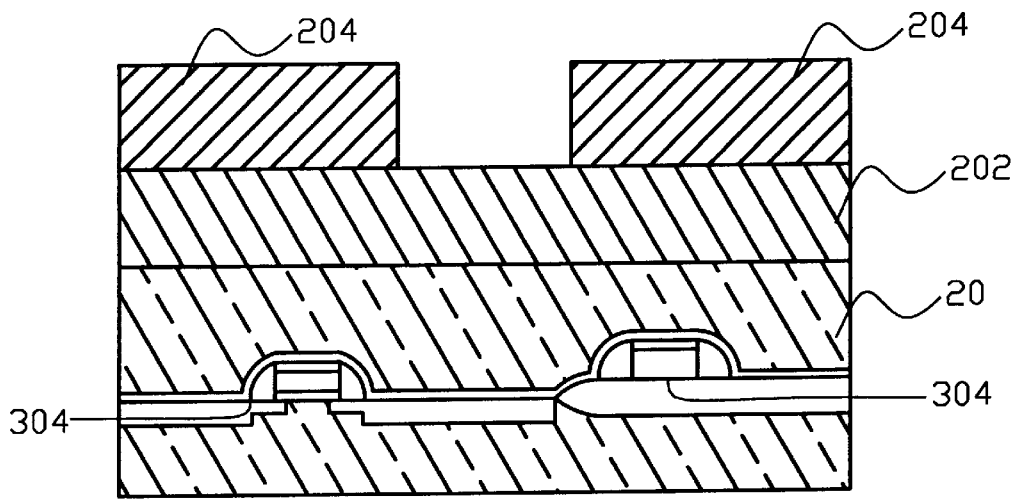
FIG. 3A to FIG. 3F show cross-sectional views illustrative of various stages in the fabrication of an electrode of capacitor of a dynamic random access memory with another embodiment of the present invention.
Figure 3B:
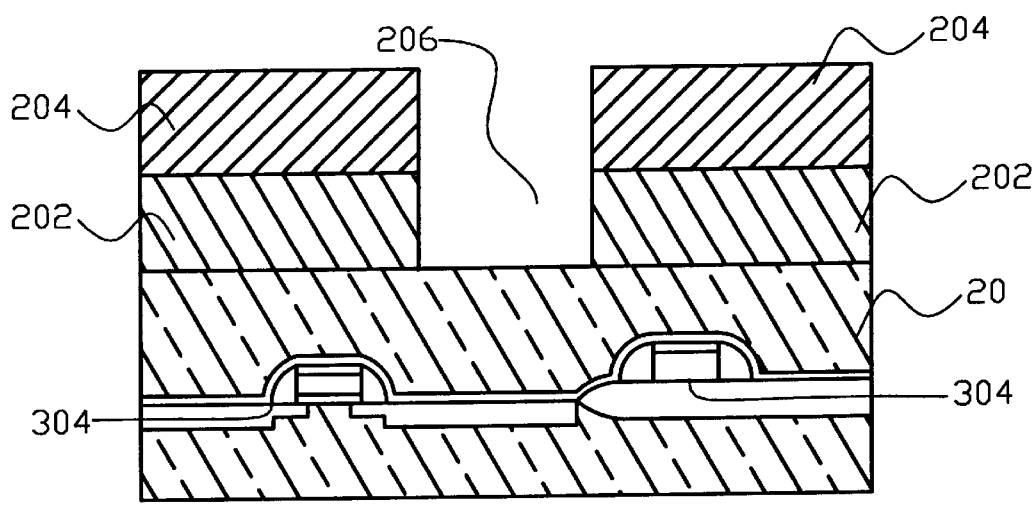
Figure 3C:
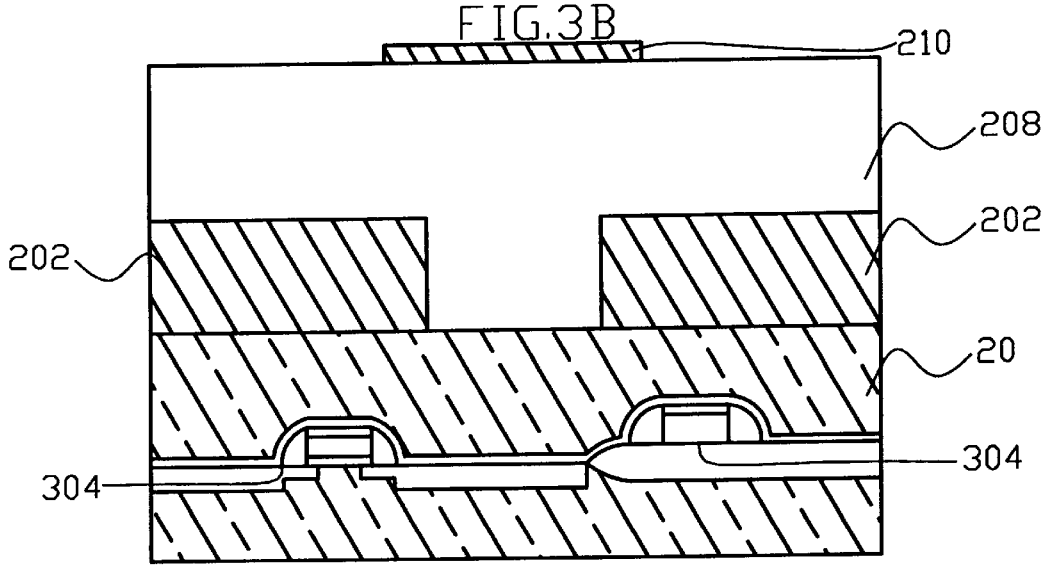
Figure 3D:
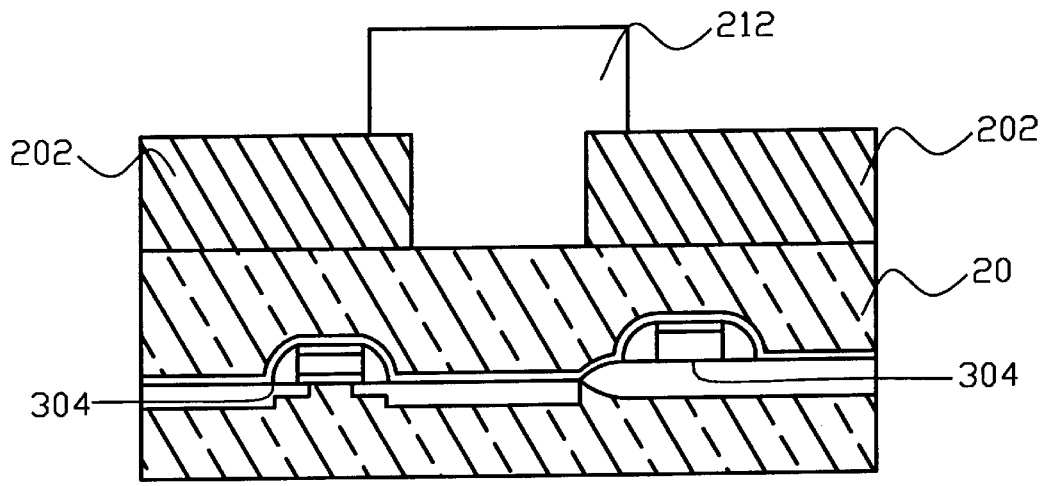
Figure 3E:
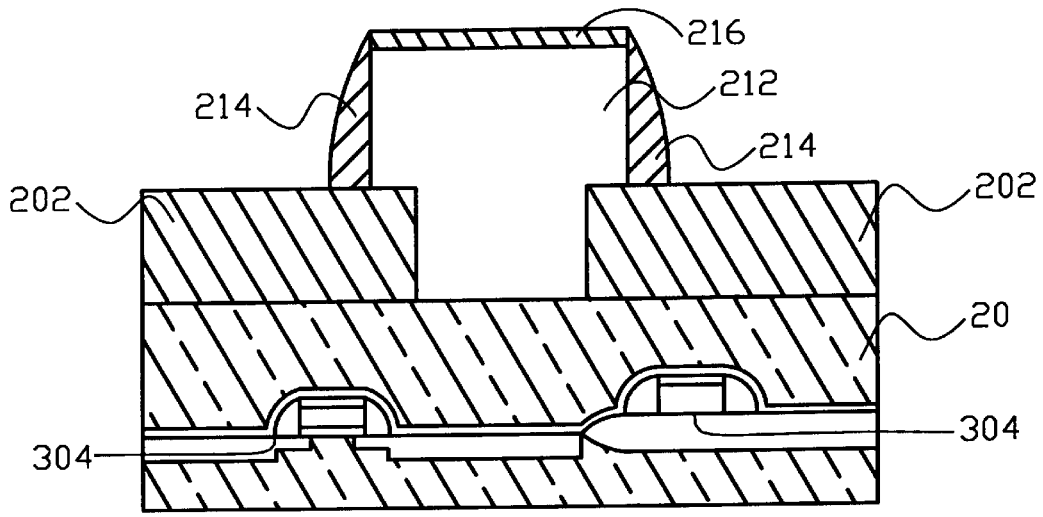
Figure 3F:
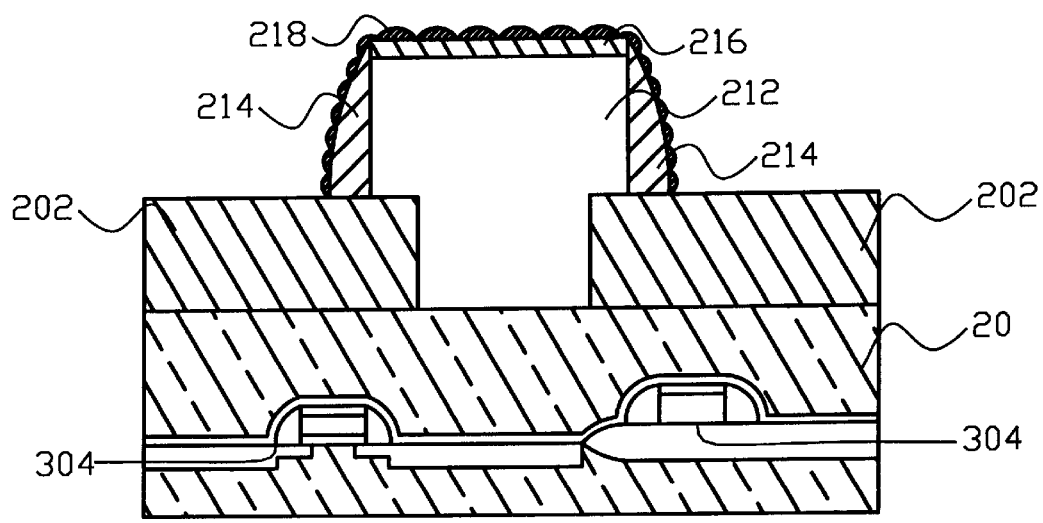

Thereafter, as shown in FIG. 2F hemi-spherical grain silicon 218 is formed on the spacer 214 and on the amorphized silicon layer 216. The process of grain formation comprises annealing amorphized silicon.

After the hemi-spherical grain silicon is formed, the fabrication of a capacitor electrode of semiconductor device is complete. The electrode of capacitor is the one that direct connects to substrate.

It should be noted that since amorphized silicon on top and in sidewalls of polysilicon rods 212 are provided by different process, there exist some differences in their property and structure. Thus, the growth of Hemi-Spherical Grain silicon on the polysilicon rod should balance two different growing condition of different amorphized silicon.

It also should be noted that because the amorphized silicon in sidewall of polysilicon rod 212 is formed by spacer method, there is no impediment on growth of amorphized silicon. The thickness is adjusted and not limited by the height of polysilicon rod 212 or the distance between neighboring polysilicon rods 212. The thickness of amorphized silicon is always enough for hemi-spherical silicon grain formation, no matter on top part or bottom part of polysilicon rod 212. The advantage is obviously when there is a plurality of electrodes and each electrode is closed to others.

In addition, since the amorphized silicon layer 216 is formed by implantation, the throughput of the invention is high for two reasons. One is the growth of amorphized silicon by implanting polysilicon is faster than direct deposition of amorphized silicon. Another is the efficiency of production in factory. In the invention, both implantation process and implantation process are used, and then two different machines are necessary. However, the requirement of deposition is larger than requirement of implantation in factory, so replacing deposition by implantation in formation of amorphized silicon increases the flexibility of production. The advantage is obvious as comparing the invention with a known method where spacer process and implantation are both necessary.

Referring to FIG. 3A to FIG. 3F, another embodiment of the invention is shown. In the embodiment, the invention is used to form an electrode of a dynamic random access memory capacitor. In the embodiment, a silicon oxide layer 302 is used as the dielectric layer 202 and the substrate 20 is a silicon substrate 30 that includes a metal-oxide-semiconductor transistor 304 or other elements of dynamic random access memory. The polysilicon rod 212 is connected to the metal-oxide-semiconductor transistor 304. These implanting particles are donor particles for the electrode direct connected to the silicon substrate 20 is a negative electrode. The other details of the embodiment are similar to the previous embodiment and those same symbols indicate same items as first embodiment.

Although specific embodiments have been illustrated and described, it will be obvious to those skilled in the art that various modifications may be made without departing from what is intended to be limited solely by the appended claims.

What is claimed is:

1. A method for forming an electrode of a semiconductor device capacitor, said method comprising:

forming a dielectric layer on a substrate;

forming a first photoresist layer on said dielectric layer, wherein said first photoresist layer defining trench area over a portion of said substrate;

removing portions of said dielectric layer to form said trench, said portions of said dielectric layer being left uncovered by said first photoresist layer;

removing said first photoresist layer;

forming a polysilicon layer over said dielectric layer, wherein said polysilicon layer filling said trench;

forming a second photoresist layer on said polysilicon layer, wherein said second photoresist layer defining a capacitor area over a portion of said polysilicon layer, said capacitor area covering said trench;

removing portions of said polysilicon layer, said portions of said polysilicon layer being left uncovered by said second photoresist layer, and residual said polysilicon layer forming a polysilicon rod;

removing said second photoresist layer;

forming an amorphized silicon spacer in sidewall of said polysilicon rod;

implanting said polysilicon rod to form an amorphized polysilicon layer on top surface of said polysilicon rod; and forming hemi-spherical grained silicon on surface of said polysilicon rod, thereby forming an electrode of said capacitor of a semiconductor capacitor.

2. The method according to claim 1, wherein said substrate comprises silicon.

3. The method according to claim 1, wherein said dielectric layer comprises silicon oxide.

4. The method according to claim 1, wherein said forming polysilicon layer comprises depositing said polysilicon layer by chemical vapor deposition.

5. The method according to claim 1, wherein said forming amorphized silicon spacer comprises forming a amorphized polysilicon layer over said polysilicon rod and said dielectric layer, then anisotropically etching said amorphized polysilicon layer.

6. The method according to claim 1, said implanting an amorphized polysilicon layer comprises implanting an amorphized polysilicon layer by donor or acceptor.

7. The method according to claim 1, wherein depth of said amorphized polysilicon layer and width of said spacer both are at sufficient thickness such that during forming said hemi-spherical grained silicon, grain formation only reacts with part of said amorphized polysilicon layer and not touches said polysilicon layer.

8. A method for forming a electrode of a dynamic random access memory capacitor, said method comprising:

forming a silicon oxide layer on a silicon substrate;

forming a first photoresist layer on said oxide layer, wherein said first photoresist layer defining trench area over a portion of said silicon substrate;

anisotropically etching portions of said oxide layer to form said trench, said portions of said oxide layer being left uncovered by said first photoresist layer;

removing said first photoresist layer;

depositing a polysilicon layer over said oxide layer, wherein said polysilicon layer filling said trench;

forming a second photoresist layer on said polysilicon layer, wherein said second photoresist layer defining a capacitor area over a portion of said polysilicon layer, said capacitor area totally covering said trench;

anisotropically etching portions of said polysilicon layer, said portions of said polysilicon layer being left uncovered by said second photoresist layer, and residual said polysilicon layer forming a polysilicon rod;

removing said second photoresist layer;

implanting said polysilicon rod to form an amorphized silicon layer on top surface of said polysilicon rod;

forming an amorphized silicon spacer in sidewall of said polysilicon rod; and forming hemispherical grained silicon on surface of said polysilicon rod; thereby forming an electrode of said dynamic random access memory capacitor.

9. The method according to claim 8, wherein said substrate includes a metal-oxide-semiconductor transistor, said metal-oxide-semiconductor transistor being part of a dynamic random access memory cell.

10. The method according to claim 8, wherein said depositing polysilicon layer comprises depositing said polysilicon layer by a low pressure chemical vapor deposition method and depositing temperature is about 580° C., said low temperature chemical vapor deposition method used silane (SiH4) to form said polysilicon layer.

11. The method according to claim 8, wherein said forming amorphized silicon spacer comprises forming an amorphized silicon layer over said polysilicon rod and said silicon oxide layer then anisotropically etching said amorphized polysilicon layer.

12. The method according to claim 8, wherein said forming amorphized silicon spacer comprises forming said amorphous spacer by a low temperature chemical vapor deposition method and depositing temperature is about 520° C., said low temperature chemical vapor deposition method used silane (SiH4) to form said amorphized layer.

13. The method according to claim 8, said implanting an amorphized polysilicon layers comprises implanting by donor, said donor comprises arsenic and phosphorous.

14. The method according to claim 8, wherein said amorphized polysilicon layer is deeper than 1000 angstroms and said spacer is wider than 1000 angstroms, both are at a sufficient thickness for forming said selective hemi-spherical grained silicon.

* * * * *